United States Patent [19]
Cheng et al.

[11] Patent Number: 5,851,299
[45] Date of Patent: *Dec. 22, 1998

[54] PASSIVE SHIELD FOR CVD WAFER PROCESSING WHICH PROVIDES FRONTSIDE EDGE EXCLUSION AND PREVENTS BACKSIDE DEPOSITIONS

[75] Inventors: David Cheng, Sunnyvale; Mei Chang, Cupertino, both of Calif.

[73] Assignee: Applied Materials, Inc., Santa Clara, Calif.

[ * ] Notice: The term of this patent shall not extend beyond the expiration date of Pat. No. 5,304,248.

[21] Appl. No.: 218,209

[22] Filed: Mar. 25, 1994

Related U.S. Application Data

[60] Division of Ser. No. 823,942, Jan. 22, 1992, Pat. No. 5,304,248, which is a continuation-in-part of Ser. No. 622,664, Dec. 5, 1990, abandoned.

[51] Int. Cl.[6] .......................... C23C 16/00; C23C 14/00; C23F 1/00; H01L 21/00
[52] U.S. Cl. .......................... 118/729; 118/728; 118/500; 118/719; 118/503; 156/345; 204/298.11
[58] Field of Search ...................................... 118/719, 725, 118/728, 729, 730, 500, 503; 156/345; 204/298.11

[56] References Cited

U.S. PATENT DOCUMENTS

| | | | |
|---|---|---|---|
| 4,842,683 | 6/1989 | Cheng et al | 156/345 |
| 4,932,358 | 6/1990 | Studley et al. | 118/728 |
| 4,951,601 | 8/1990 | Maydan et al. | 118/719 |
| 4,962,727 | 10/1990 | Harada | 118/723 |
| 4,963,393 | 10/1990 | Goela et al. | 427/248.1 |
| 4,963,713 | 10/1990 | Horiuchi et al. | 219/121.43 |
| 4,978,412 | 12/1990 | Aoki et al. | 156/345 |
| 4,990,374 | 2/1991 | Keeley et al. | 427/255.1 |
| 5,013,400 | 5/1991 | Korasaki et al. | 156/643 |
| 5,033,407 | 7/1991 | Mizuno et al. | |
| 5,230,741 | 7/1993 | van de Ven et al. | 118/728 |
| 5,238,499 | 8/1993 | van de Ven et al. | 118/724 |
| 5,262,029 | 11/1993 | Erskine et al. | 204/298.15 |
| 5,304,248 | 4/1994 | Cheng et al. | 118/728 |
| 5,374,594 | 12/1994 | van de Ven et al. | 437/247 |
| 5,620,525 | 4/1997 | van de Ven et al. | 118/728 |

FOREIGN PATENT DOCUMENTS

| | | |
|---|---|---|
| 0 383 491 | 8/1990 | European Pat. Off. . |
| 0434227 | 11/1990 | European Pat. Off. . |
| 0448346 | 3/1991 | European Pat. Off. . |
| 0 467 623 A2 | 1/1992 | European Pat. Off. . |
| 0 606 751 A1 | 7/1994 | European Pat. Off. . |
| 0 619 381 A1 | 12/1994 | European Pat. Off. . |
| 3013577 | 1/1991 | Japan . |
| 2196019 | 10/1986 | United Kingdom . |

OTHER PUBLICATIONS

European Search Report EP 91120906.2
European Search Report 93 10 0746

*Primary Examiner*—R. Bruce Breneman
*Assistant Examiner*—Jeffrie R. Lund
*Attorney, Agent, or Firm*—Thomason & Moser

[57] ABSTRACT

An improved apparatus for CVD processing is described wherein a wafer mounted on a vertically movable susceptor beneath a gas outlet or showerhead is raised into contact with a shield ring which normally rests on a ring support in the chamber. The shield ring engages the frontside edge of the wafer, lifting the shield ring off its support, when the susceptor and the wafer are raised to a deposition position in the chamber. The shield ring, by engaging the frontside edge of the wafer, shields the edge of the top surface of the wafer, as well as the end edge and the backside of the wafer, during the deposition. Matching tapered edges, respectively, on the susceptor and the shield ring permit alignment of the shield ring with respect to the susceptor, and alignment of the wafer to the susceptor and the shield ring. Alignment means are also disclosed to circularly align the shield ring to its support in the chamber. Multi-unit shield rings permit the use of wider shield rings and prevent cracking of the shield ring due to thermal stresses caused by temperature differences near and away from the wafer during processing. These shield rings may also have tapered edges to ensure alignment of the rings with respect to each other.

34 Claims, 4 Drawing Sheets

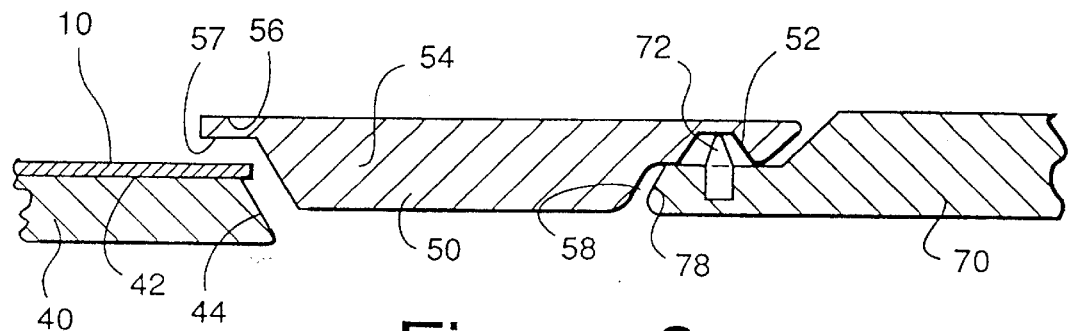
Figure 3
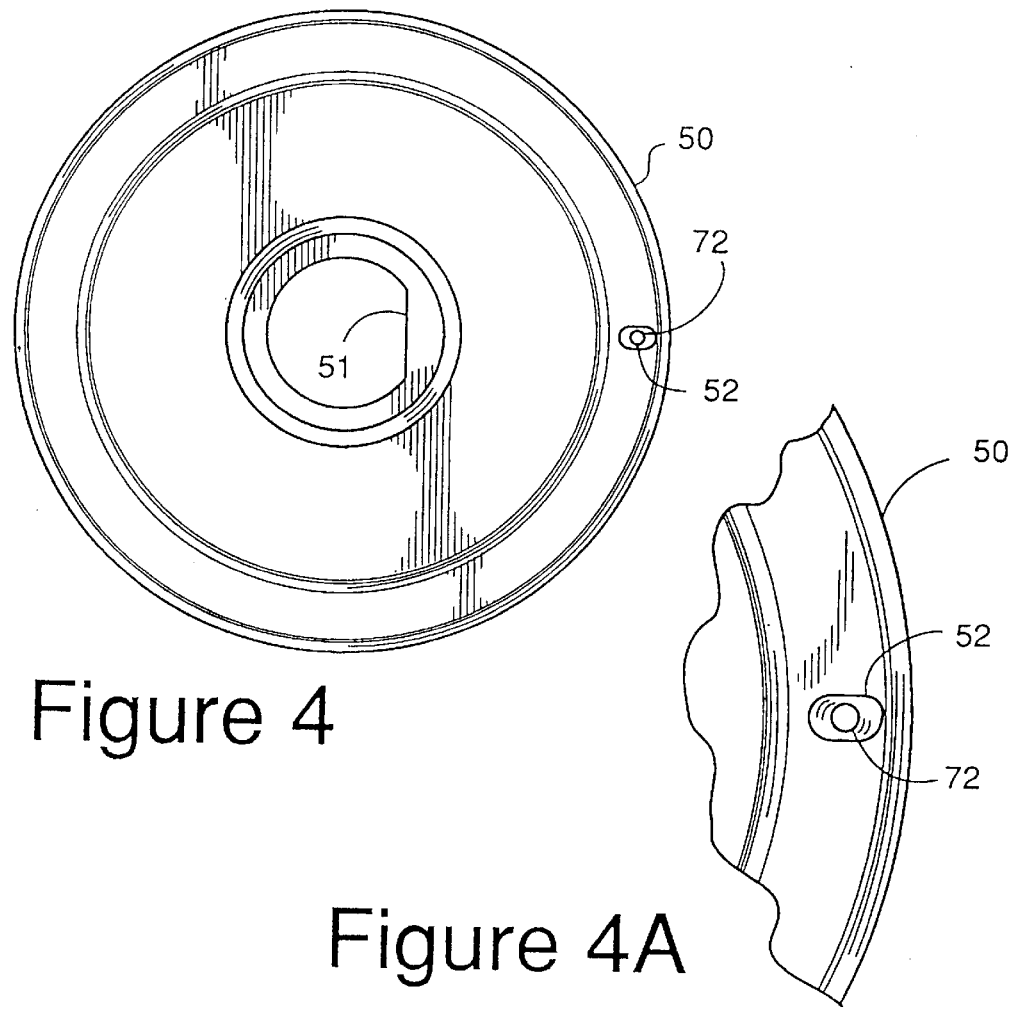
Figure 4
Figure 4A

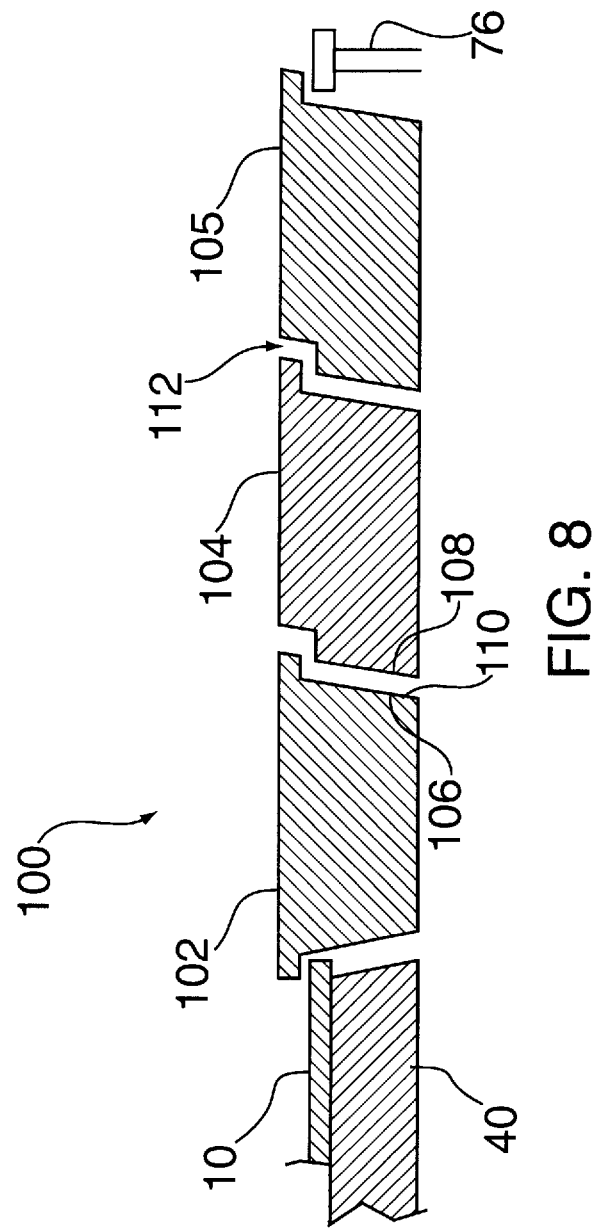

PASSIVE SHIELD FOR CVD WAFER PROCESSING WHICH PROVIDES FRONTSIDE EDGE EXCLUSION AND PREVENTS BACKSIDE DEPOSITIONS

This is a division of application Ser. No. 07/823,942 filed Jan. 22, 1992, now U.S. Pat. No. 5,304,248, which is a continuation-in-part of application Ser. No. 07/622,664 filed Dec. 5, 1990, abandoned.

BACKGROUND OF THE INVENTION

1. Field of the Invention

This invention relates to apparatus for CVD processing of a semiconductor wafer. More particularly, this invention relates to a shield which provides frontside edge exclusion of deposited materials on a semiconductor wafer during CVD processing as well as preventing backside depositions.

2. Description of the Related Art

In the deposition of materials on a semiconductor wafer during the formation of an integrated circuit structure, it is desirable to exclude deposited materials from the backside of the wafer, as well as from the edges of the front surface and the end edges of the wafer. This is of particular importance where the deposited material does not adhere to the native oxides usually present on such surfaces, which may require prior processing of such surfaces to promote adhesion.

For example, when tungsten is deposited over a silicon oxide insulation layer on a semiconductor wafer by CVD processing, the oxide surface must be pre-treated before the tungsten being deposited will properly adhere to the surface, e.g., by depositing a titanium tungsten (TiW) or titanium nitride (TiN) layer on the oxide surface. When tungsten deposits on the edges of the front surface of the wafer, or on the backside of the wafer, (which surfaces have not been pretreated with TiW or TiN) the deposited tungsten does not adhere properly, and flakes off as particles. As is well known, the generation of particles has a deleterious effect on subsequent wafer processing.

As shown in FIG. 1, in prior art deposition apparatus for CVD processing of a wafer, deposition gas or gases, containing a material such as tungsten to be deposited onto the front or top surface of a semiconductor wafer 10, enters the CVD chamber through a gas inlet or "showerhead" 20 which as shown is positioned above the wafer 10. A pumping ring 24 is located on a supporting lip or shoulder 26 of the chamber and has an inner diameter (ID) selected, with respect to the outer diameter (OD) of a circular susceptor 30 on which wafer 10 rests, to control the flow therebetween of a nonreactive purging gas from beneath the susceptor 30. The purpose of the purging gas flow is to inhibit passage of the deposition gas toward the edge and/or backside of the wafer, i.e., to help prevent unwanted deposition on such surfaces.

Unfortunately, however, it has been found that even when using such prior art apparatus, materials such as tungsten may still deposit on the frontside edges, end edges, and backside of the semiconductor wafer during deposition by CVD processing.

Studley et al, U.S. Pat. No. 4,932,358, in addressing this problem, discloses a seal ring which presses down against a wafer on a CVD chuck continuously around the outer periphery of the wafer and with sufficient force to hold the backside of the wafer against the chuck. The seal ring has one surface which contacts the front of the wafer and a second surface that extends close to the chuck, which is larger than the wafer, so that the edge of the wafer is also excluded from CVD coating. However, a complicated mounting mechanism is required to move the seal ring in and out of clamping engagement with the wafer and to maintain alignment between the seal ring and the wafer. Further, the seal ring can only be as wide as the diameter of the chuck.

It would, therefore, be desirable to provide simplified seal ring means which would engage a semiconductor wafer to protect the edges and backside of the wafer from undesirable depositions on such surfaces of the wafer.

SUMMARY OF THE INVENTION

It is an object of this invention to provide shield means which will engage the frontside edge of a semiconductor wafer to inhibit deposition gases from coming into contact with such frontside edge surfaces, as well as the end edge and backside of the wafer, when said shield means and the periphery of the wafer are in contact with each other.

It is another object of this invention to provide shield means comprising a shield ring with a tapered inner edge which will center the wafer with respect to the shield ring when the wafer and shield ring are in contact with each other.

It is a further object of this invention to provide shield means comprising a shield ring with a tapered inner edge and a susceptor with a matching tapered outer edge which will center the shield ring with respect to the susceptor, when the wafer and shield ring are in contact with each other.

It is yet a further object of this invention to provide shield means which will engage the frontside edge of a semiconductor wafer to protect the frontside edge surfaces, as well as the backside of the wafer, from undesirable depositions during CVD processing of the wafer, and support means for the shield means when the wafer and shield ring are not in contact with each other.

It is still a further object of this invention to provide shield means which will engage the frontside edge of a semiconductor wafer to protect the frontside edge surfaces, as well as the backside of the wafer, from undesirable depositions during CVD processing of the wafer, support means for the shield means when the wafer and shield ring are not in contact with each other, and alignment means associated with the shield means and the support means to align the shield means both laterally and rotationally with respect to the support means when the shield means rests on the support means.

It is yet another object of this invention to provide shield means that will engage the frontside edge of a semiconductor wafer to protect the frontside edge surfaces, as well as the backside of the wafer, from undesirable depositions during CVD processing of the wafer that has reduced particle generation.

It is a still further object of the invention to provide a shield means that has reduced susceptibility to thermal stress caused by temperature differences in various portions of said chamber during processing.

These and other objects,of the invention will be apparent from the following description and accompanying drawings.

BRIEF DESCRIPTION OF THE DRAWINGS

FIG. 3 is an enlarged fragmentary vertical cross-section of a portion of the apparatus shown in FIG. 2, showing the non-engagement of the shield means by the wafer and wafer support and showing the shield means resting on shield support means.

FIG. 4 is a bottom view of the shield ring of the invention showing a rotational alignment slot and an alignment pin on the shield support means in the slot.

FIG. 4A is an enlarged fragmentary view of the shield means of FIG. 4, showing the alignment slot and pin therein.

FIG. 8 is an enlarged fragmentary vertical cross-section of a portion of a multi-unit shield ring showing engagement of the innermost shield ring by the wafer and wafer support and showing the outermost shield ring in non-contact with the shield support means.

DETAILED DESCRIPTION OF THE INVENTION

Figure 1:
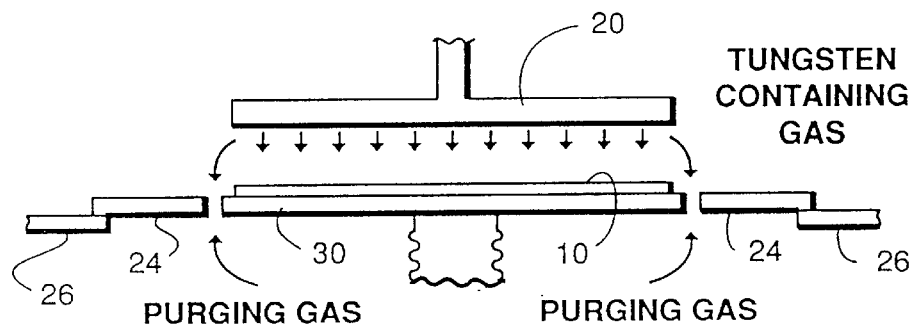
FIG. 1 is a fragmentary vertical cross-sectional view of prior art apparatus used in the CVD processing of semiconductor wafers.
Figure 2:
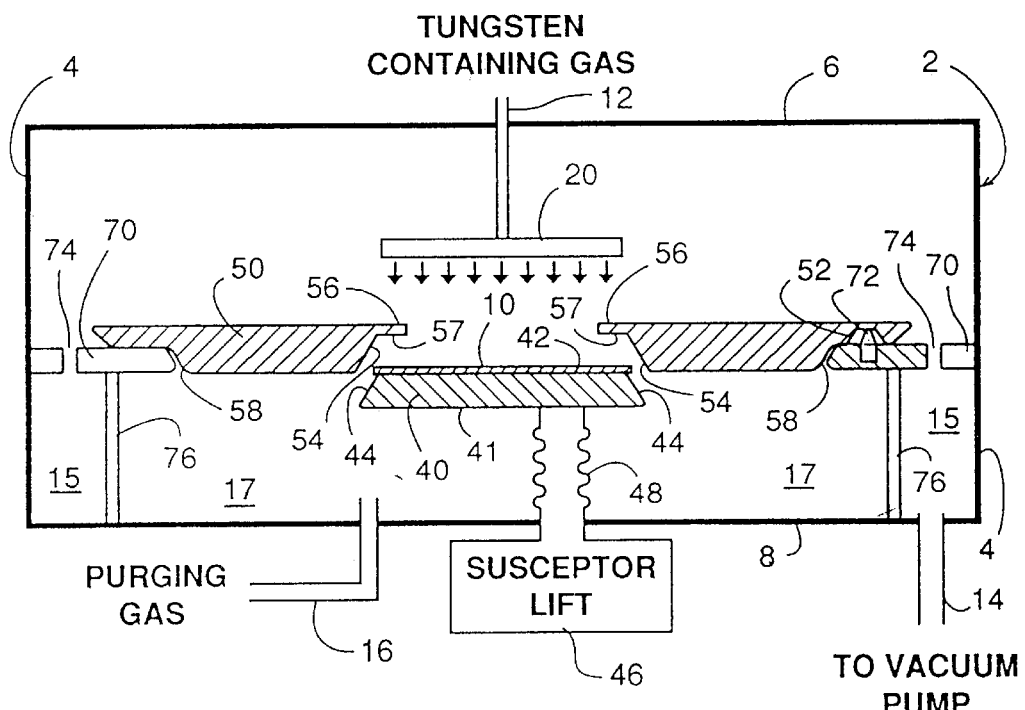
FIG. 2 is a vertical cross-sectional view of CVD processing apparatus constructed in accordance with the invention with a wafer support bearing a semiconductor wafer thereon shown in a lowered, non-engaged position with a shield means resting on support means.
Figure 5:
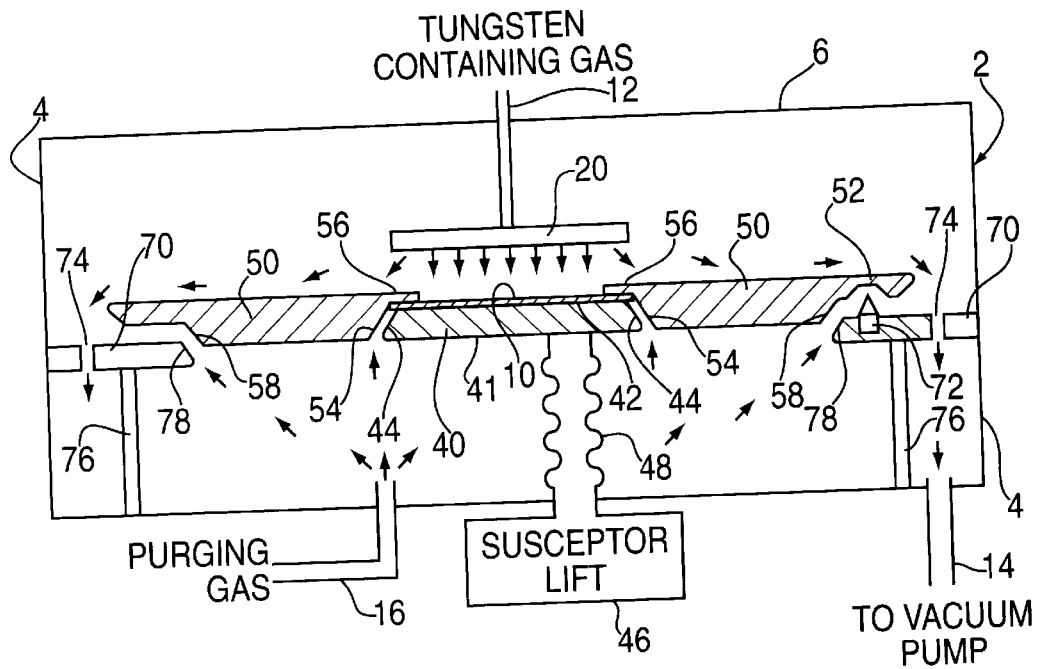
FIG. 5 is a vertical cross-sectional view of the CVD processing apparatus of FIG. 2 with the wafer support and wafer thereon shown in a raised position of engagement with the shield means which has been lifted above the shield support means.
Figure 6:
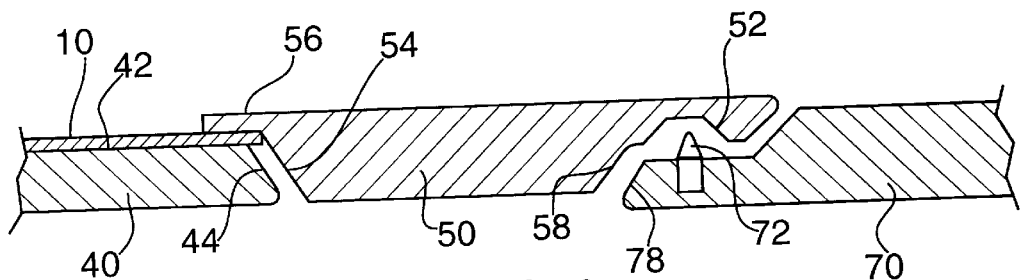
FIG. 6 is an enlarged fragmentary vertical cross-section of a portion of the apparatus shown in FIG. 5, showing engagement of the shield means by the wafer and wafer support means and showing the shield means in non-contact with the shield support means.

Referring now to FIGS. 2–6, and in particular to FIGS. 2 and 5, a vacuum deposition chamber capable of CVD processing is generally indicated at 2. The chamber 2 contains a wafer 10 mounted on a vertically movable wafer support or susceptor 40 beneath a gas outlet or showerhead 20 through which process gas enters chamber 2. A shield ring 50, which normally rests on shield support means 70 in the chamber 2, engages the frontside edge of the wafer 10 when the susceptor 40 and the wafer 10 are raised to a deposition position in chamber 2, as shown in FIGS. 5 and 6. The shield ring 50, by engaging the frontside edge of the wafer 10, shields the edge of the top surface of the wafer 10, as well as the end edge and the backside of the wafer 10, from the deposition gases as will be explained in more detail below.

The chamber 2 may comprise one chamber of a multiple chamber integrated processing system for performing a number of process steps on a semiconductor wafer in a plurality of inter-connected vacuum processing chambers. Such a multi-chamber integrated process system is disclosed and claimed in Maydan et al, U.S. Pat. No. 4,951,601, assigned to the assignee of this invention, cross reference to which is hereby made.

The chamber 2 includes sidewalls 4, a top wall 6 and a bottom wall 8. Process gas entering the inlet tube 12 in the top wall 6 is discharged into the vacuum chamber 2 through the showerhead 20 which, as shown, is positioned above the wafer 10. Purging gas enters the chamber 2 from an inlet port or tube 16 through the bottom wall 8. A vacuum port 14, leading to a support means 70 for the shield ring 50 may be connected to the bottom wall 8 or the sidewalls 4 of the chamber 2.

A sleeve or skirt member 76 depends downwardly from the support means 70 to the bottom wall 8 to divide the bottom portion of the chamber 2 into an outer portion 15 of the chamber 2, in communication, with the vacuum port 14, and an inner portion 17 into which the purge gas flows from the inlet 16. Pumping holes or openings 74 in the support means 70 permit both process gas and purge gas to enter the outer portion 15 from which they are pumped out of the chamber 2 via vacuum port 14.

A susceptor 40, on which the wafer 10 is supported in the chamber 2, comprises a disk-like member having a broad base or bottom surface 41 with a tapered sidewall 44 leading to a narrower top surface 42 which is; designed to be approximately equal in diameter to the diameter of the wafer 10 at the deposition temperature, e.g., at a temperature ranging from about 200° C. to about 700° C.

The susceptor 40, as shown, is movable vertically within the chamber 2 via lift means which may comprise, by way of example and not of limitation, fluid power means 46 and an expandable lift tube means 48 having bellows to permit vertical expansion of the tube means 48 when hydraulic or pneumatic fluid is pumped into lift tube means 48 by fluid power means 46. FIG. 2 shows lift tube means 48 in a retracted position, resulting in the susceptor 40 and the wafer 10 thereon being in a lowered position (as seen in both FIGS. 2 and 3). FIG. 5, in contrast, shows lift tube means 48 in an expanded position to raise the susceptor 40 and the wafer 10 thereon into position below the showerhead 20 for CVD processing to deposit the desired material onto the wafer.

In accordance with the invention, when the susceptor 40 and the wafer 10 thereon are raised to the operating or deposition position, as shown in FIGS. 5 and 6, the frontside edge (the edge of the top surface) of the wafer 10 engages the undersurface of an inner lip 56 of the shield ring 50 and lifts the shield ring 50 up from the support means 70 on which the shield ring 50 normally rests when not engaged by the wafer 10.

The shield ring 50, as seen in the top view of FIG. 4, is generally circular or doughnut shaped, having a generally circular central opening with a flat edge 51 on one side of the central opening corresponding to the conventional orientation flat found on semiconductor wafers.

The shield ring 50 may be formed of a metal such as aluminum, stainless steel, nickel, monel or any other metal which would be compatible with other materials used in the construction of the deposition apparatus, i.e., the walls, the susceptor, the showerhead, etc. which are all conventionally made of aluminum or stainless steel. Preferably, however, the shield ring 50 will be constructed of a non-metallic material which: (1) will be compatible with the operating temperature employed during the processing, (2) will be compatible with the vacuum conditions in the chamber, i.e., will not outgas, and (3) will be chemically inert, i.e., nonreactive, with the materials used in the deposition process.

Since materials used in the deposition process may also deposit on the shield ring, necessitating cleaning of the ring, the shield ring 50, in the preferred embodiment, should be constructed of a ceramic material such as, for example, aluminum oxide, magnesium oxide, silicon nitride, boron nitride, zirconium oxide, magnesium fluoride, or quartz. The shield ring 50 could also be constructed of a base material, e.g., aluminum, and then coated or clad with a covering of a. non-metallic material meeting the above criteria, such as the above described ceramic materialk, or an anodized coating of the base metal, e.g., a coating of aluminum oxide formed on an aluminum shield ring by anodizing it.

The central opening of the shield ring 50 is provided with a tapered inner edge 54 on the lower surface of the ring 50 having approximately the same angle of taper as the tapered outer edge 44 of the susceptor 40, i.e., a matching taper. The tapered inner edge 54 terminates, at its upper end, at the inner lip 56. The inner lip 56, in turn, is dimensioned to inwardly extend circumferentially from the tapered inner edge 54 a predetermined distance to extend over the frontside edge of the wafer 10. The inner lip 56 has an undersurface 57 which is flat and parallel to the surface of the wafer 10 to permit flat contact therebetween and to provide a seal to inhibit passage of process gases therebetween.

The minimum amount or extent of coverage of the frontside or top surface edge of the wafer 10 by the inner lip 56 of the shield ring 50 will be an amount sufficient to at least provide a seal therebetween which will prevent process gases from reaching the end edge and rear surface of the wafer 10. The actual amount of coverage of the front side edge of the wafer 10 by the inner lip 56 of the shield 50 will be further governed, at least in some deposition processes, by the extent of coverage of the top surface of the wafer 10 by previous processing steps. For example, when depositing tungsten on a silicon oxide surface of a wafer 10, i.e., either the oxide coated surface of the substrate itself or an oxide coating on previously formed epitaxial silicon or polysilicon surfaces, the silicon oxide must be pretreated with another material, e.g., TiW or TiN, to provide proper adherence of the tungsten layer, and to prevent particles of tungsten from flaking off. If such a pretreatment step did not extend to the end edge of the wafer, then the area not so pretreated must be covered by the inner lip 56 of the shield ring 50 to prevent deposition and resultant particle formation on such unprotected surface. The inner lip will, therefore, usually be dimensioned to extend inwardly over the front side edge of the wafer a distance of from about 1.5 to about 6 millimeters (mm), typically about 5 mm, to provide the desired sealing and front side edge shielding.

The ID of the top portion of the tapered inner edge 54 on the shield ring 50 is just slightly larger than the OD of the top surface 42 of the susceptor 40 by approximately the same amount. This tolerance is provided for at least two reasons. First, the tolerance is provided to compensate for possible differences in thermal expansion when different materials are respectively used in constructing the susceptor 40 and the shield ring 50. The tolerance is also provided to ensure that as the susceptor 40 and the wafer 10 thereon are lifted into contact with the shield ring 50, the shield ring 50 will not be supported by contact between the tapered inner edge 54 of the shield ring 50 and the tapered outer edge 44 of the susceptor 40, but rather by contact of the underside of the inner lip 56 with the top surface of the wafer 10 to enhance the sealing therebetween.

By tapering the outer edge 44 of the susceptor 40 and the inner edge 54 of the shield ring 50 by the same angle, an angle which will usually be about 30°, but which may vary from about 15° to about 60°, i.e., by providing matching tapers, any possible misalignment of the shield ring 50 with respect to the susceptor 40 (and the wafer 10 thereon) may be corrected by contact between the respective tapered surfaces which will cause shield ring 50 to laterally shift or slide back into alignment with the susceptor 40.

Figure 7:
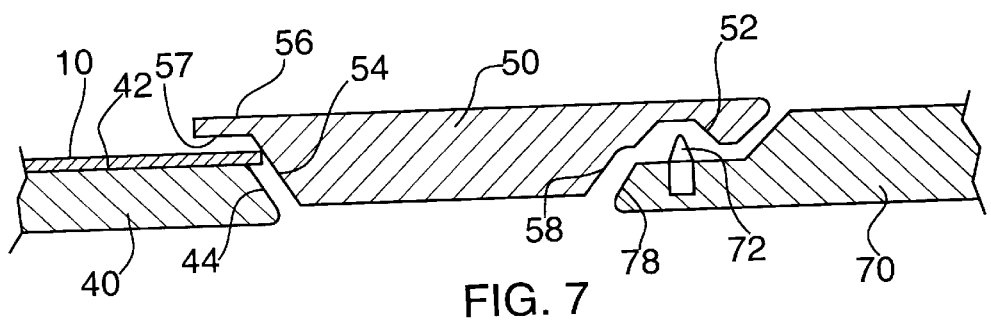
FIG. 7 is an enlarged fragmentary vertical cross sectional view of a portion of the apparatus shown in FIG. 2 with the wafer shown in an offset or skewed position and being engaged by the tapered edge of the shield means to urge the wafer back into an aligned position.

The tapered edge 54 of the shield ring 50 serves an additional function in the potential lateral alignment of the wafer 10, should the wafer lid not be positioned on the susceptor 40 in coaxial alignment therewith. As seen in FIG. 7, when the wafer 10 is misaligned with respect to the susceptor 40, the edge 11 of the wafer 10 extending beyond the top surface 42 of the susceptor 40 will come into contact with the tapered edge 54 of the shield ring 50 as the susceptor 40 and the wafer 10 are raised into position. The relatively light weight of the wafer 10 with respect to the weight of the shield ring 50 will cause the wafer 10 to shift laterally to realign the wafer 10 with the susceptor 40 as the susceptor 40 and the wafer 10 thereon continue to rise into the processing position.

The shield ring 50 is supported in the chamber 2, when not in engagement with the susceptor 40 and the wafer 10, by resting on a support means 70 which may comprise a circular shoulder or support bracket secured to the sidewall 4 of the chamber 2. Alternatively, support means 70 may itself comprise a ring which is, in turn, supported by a rigid support secured to the sidewall 4 of the chamber 2.

In a preferred embodiment, the shield ring 50 is maintained in rotational alignment with the support means 70 by alignment means carried on the under surface of the shield ring 50 and the upper surface of the support means 70 which interact when the susceptor 40 and the wafer 10 are lowered out of engagement with the shield ring 50, i.e., the position shown in FIGS. 2 and 3. As shown in those figures (as well as in FIGS. 4, 4A, 5 and 6) the alignment means may comprise a beveled or tapered pin 72 on the upper surface of the support means 70 which is received in a similarly beveled or tapered slot opening 52 which is formed in the undersurface of the shield ring 50 and which extends radially outward. As the shield ring 50 is lowered onto the support means 70, if the shield ring 50 is rotationally misaligned with respect to the support means 70, the respective beveled side edges of the pin 72 and the opening 52 will contact one another and move the shield ring 50 back into rotational alignment so that the flat portion 51 maintains the same orientation.

As shown in FIG. 7, the shield ring 50 may also be provided with a tapered outer surface or edge 58 along at least the lower portion of the outer edge of the shield ring 50 which matches a similarly tapered inner edge 78 provided on the support means 70. When the shield ring 50 has been raised off the support means 70 by the susceptor 40, the tapered edges 58 and 78 cooperate to provide a passageway for purging gas or gases, i.e., nonreactive gases such as argon, helium or the like, to pass through from below the wafer 10 in the chamber 2, as shown in FIG. 5. The purging gas pressure can be maintained somewhat higher than the reaction or deposition gas pressure, thereby ensuring a purging gas screen around the wafer. Such purging gases act to confine the process or deposition gases in the chamber 2 to the volume above the wafer 10 to facilitate the deposition thereon and to inhibit deposition gas molecules from passing into the area around the backside of the wafer or to other areas in the chamber 2 where they are not desired.

It should be further mentioned, in this regard, that while the purging gas does not usually pass between the end edge of the wafer 10 and the inner edges of the shield ring 50 in the structure of the invention, should there be any passageway or opening between the wafer and the shield ring, i.e., should an incomplete seal be formed between the frontside, edge or the wafer 10 and the undersurface 57 of the lip 56 of the shield ring 50, the purging gas will pass through such openings, thereby inhibiting the undesirable passage of process gases through such openings to the shielded portions of the wafer 10, i.e., to the frontside edge, end edge and the backside of the wafer 10.

The above description has been made showing a single unit ring shield means of the invention. Since it is desired to move the reactant gases as far as possible from the area of the underside of the wafer being processed, it is desirable to utilize a ring shield that is as wide as possible, i.e., that covers most of the area between the wafer on the susceptor and the sidewalls of the CVD chamber. However, as the shield means becomes wider, it becomes subject to thermal stresses due to the temperature differences between the temperature near the wafer and susceptor, which is generally higher than the remainder of the chamber, and the temperature near the sidewalls of the chamber, which is generally lower than that of the wafer. These thermal stresses may result in cracking of metal and ceramic parts. When the shield means cracks, of course processing gases can reach the top, side edge and bottom side of the wafer. Further, as the ring shield is exposed to differing temperatures, it is subject to changes of dimensions, causing the ring shield to rub against the wafer and against the ring shield support. This rubbing results in particle generation, particularly when the ring shield is made of a material such as aluminum. As is well understood, the generation of particles in a CVD chamber is to be avoided. The multi-unit ring shields of the invention discussed hereinbelow in greater detail, can be made of ceramic which is a much harder material than aluminum for example, and that is much less likely to generate particles within the chamber. Since the width of each unit of a multi-unit ring shield can be optimized with respect to temperature differences at different places within the chamber, cracking can also be eliminated.

FIG. 8 shows a preferred embodiment of a multi-unit ring shield 100. The ring shield 100 as shown in FIG. 8 comprises an inner ring 102, an adjacent ring 104 and outermost ring 105. The side 106 of the inner ring 102 away from the wafer and the side 108 of the outer ring 104 adjacent to the inner ring are tapered in complementary manner so that when in contact with each other, the inner ring 102 fits onto and forms a seal with the adjacent ring 104. In like manner the sides of the adjacent ring 104 and the outermost ring 105 are also tapered so that when in contact with each other, the adjacent ring 104 fits onto and forms a seal with the outermost ring 105. The multi-unit ring shield 100 has the advantage that it can be made much wider without cracking than can a single unit ring shield 50.

FIG. 8 also illustrates the inner ring shield 102 in contact with the wafer 10 during processing. The opening 110 between the inner ring 102 and the adjacent ring 104 and opening 112 between the adjacent ring 104 and the outermost ring 105 allows purging gas to pass therethrough.

Thus the invention provides means for preventing or inhibiting undesirable deposition of materials on the frontside edge, end edge and backside of a semiconductor wafer during CVD processing comprising a shield ring in the deposition chamber which engages the top surface of the wafer during deposition. Matching tapered surfaces respectively on the susceptor and the shield ring permit alignment of the shield ring with respect to the susceptor, as well as permitting the wafer to be aligned to the shield ring. Optional alignment means on the shield ring and a support means used to support the shield ring when not engaged by the wafer permit alignment of the shield ring with respect to the support means,. Matching tapered surfaces on the shield ring and the support means provide a purging gas passageway when the shield ring is not in contact with the support means, e.g., during processing of the wafer. Use of a multi-unit shield ring permits the use of wide area shield rings that can further remove the process gas from the underside of the wafer and decreases the likelihood of contact of the processing gas and the backside of the wafer. The multi-unit shield ring permits the use of hard, non-particle generating materials such as ceramic in the construction of wide shield rings that are not susceptible to cracking due to temperature differences within the chamber during CVD processing. A purging gas can pass between the units of the ring shield to allow a positive flow in the area of the wafer, further discouraging reactant gases from reaching the underside of the wafer.

The Figures have been explained in terms of processing a semiconductor wafer as the workpiece, but the invention is not so limited and other workpieces can be employed with concomitant and suitable changes in the configuration of the workpiece support or susceptor and the shield means. Further, although as illustrated the susceptor is moveable vertically within the processing chamber, other configurations can be used such as horizontal movement of the susceptor and the wafer.

Having thus described the invention what is claimed is:

1. In a vacuum processing system, apparatus for shielding a portion of a workpiece that is supported within the system comprising:

a workpiece support having a top surface for supporting the workpiece within the system;

a shield for engaging a portion of said workpiece and for preventing deposition of materials upon said engaged portion of said workpiece; and a movable shaft, connected to said workpiece support, for moving said workpiece support to engage said portion of said workpiece with said shield.

2. The apparatus of claim 1 wherein said workpiece support further comprises an outer edge that is inwardly tapered from a bottom surface to said top surface.

3. The apparatus of claim 2 wherein said shield further comprises:

an inner edge that is outwardly tapered from a top surface to a bottom surface; and a lip extending inwardly from said inner edge to engage a top edge of said workpiece.

4. The apparatus of claim 3 wherein said tapered edge of said workpiece support is of a smaller dimension than said tapered inner edge of said shield and of like angle, whereby said shield may be moved into alignment with said workpiece support by contact between said respective tapered edges as said workpiece is moved into a engagement with said shield.

5. The apparatus of claim 4 wherein top surface of said workpiece support is circular and has a diameter that is about the same diameter as the workpiece.

6. The apparatus of claim 5 wherein said shield has an annular plan form.

7. The apparatus of claim 1 wherein said shield is supported proximate said workpiece support by a shield support such that said shield and said portion of said workpiece that engages said shield are spaced apart when said movable shaft disengages the workpiece from said shield.

8. The apparatus of claim 7 further comprising alignment means, connected to said shield and said shield support, for aligning said shield with the shield support.

9. The apparatus of claim 8 wherein said alignment means comprises a slot attached to a bottom surface of said shield and a pin, for engaging said slot, attached to an upper surface of said shield support.

10. The apparatus of claim 7 wherein said shield has a tapered outer edge that corresponds to a tapered inner edge of said shield support such that when the shield is engaged by said workpiece and disengaged from said shield support the corresponding tapered edges of said shield and said shield support form a passageway.

11. The apparatus of claim 1 wherein said shield further comprises a plurality units.

12. The apparatus of claim 1 wherein said shield comprises two units, an inner unit adjacent to said workpiece support, and an outer unit having an inner edge that engages an outer edge of said inner unit.

13. The apparatus of claim 12 wherein said workpiece support further comprises an outer edge that is inwardly tapered from a bottom surface to said top surface and said inner edge of said inner unit further comprises an inner edge that is outwardly tapered from a top surface to a bottom surface at an angle that is substantially similar to an angle of taper of said outer edge of said workpiece support.

14. The apparatus of claim 13 wherein said inner unit of said shield contains a lip extending inwardly from said inner edge to engage a top edge of said workpiece.

15. The apparatus of claim 13 wherein said outer edge of said inner unit is tapered to match an angle of taper of said inner edge of said outer unit.

16. The apparatus of claim 12 wherein said outer unit is supported proximate said inner unit by a shield support.

17. The apparatus of claim 12 wherein said inner and outer units have annular plan forms.

18. A vacuum deposition apparatus for processing a semiconductor wafer which comprises:
- a vacuum deposition chamber;
- a susceptor in said chamber for supporting said semiconductor wafer, said susceptor having an outer edge extending from a bottom surface to a top surface;
- a process gas inlet located in said vacuum deposition chamber above the top surface of the susceptor;
- a non-reactive gas inlet for providing a non-reactive gas to a space within said chamber that is below said top surface of said susceptor; and
- a shield mounted in said chamber engagable by a front side edge of said semiconductor wafer to shield said front side edge of said semiconductor wafer during processing to prevent deposition on said front side edge of said semiconductor wafer, said shield having an inner edge extending from the bottom surface of said shield to the bottom surface of a lip on said shield, wherein said lip extends inwardly to engage the front side edge of said semiconductor wafer and said inner edge of said shield and said outer edge of said susceptor define a cavity, coupled to said space, for retaining said non-reactive gas proximate a circumferencial edge of the semiconductor wafer.

19. The apparatus of claim 18 wherein said outer edge of said susceptor is inwardly tapered from said bottom surface to said top surface.

20. The apparatus of claim 19 wherein said inner edge of said shield is outwardly tapered from a top surface to a bottom surface.

21. The apparatus of claim 20 wherein said tapered edge of said susceptor is of a smaller dimension than said tapered inner edge of said shield and of like angle, whereby said shield may be moved into alignment with said susceptor by contact between said respective tapered edges as said semiconductor wafer is moved into a engagement with said shield.

22. The apparatus of claim 21 wherein said top surface of said susceptor is circular and has a diameter that is about the same diameter as the semiconductor wafer.

23. The apparatus of claim 22 wherein said shield has an annular plan form.

24. The apparatus of claim 18 wherein said shield is supported proximate said susceptor by a shield support and said susceptor is coupled to a moveable shaft that moves said susceptor vertically to engage said shield, such that said shield and said portion of said semiconductor wafer that engages said shield are spaced apart when a movable shaft disengages the semiconductor wafer from said shield.

25. The apparatus of claim 24 further comprising alignment means, connected to said shield and said shield support, for aligning said shield with the shield support.

26. The apparatus of claim 25 wherein said alignment means comprises a slot attached to a bottom surface of said shield and a pin, for engaging said slot, attached to an upper surface of said shield support.

27. The apparatus of claim 24 wherein said shield has a tapered outer edge that corresponds to a tapered inner edge of said shield support such that when the shield is engaged by said semiconductor wafer and disengaged from said shield support the corresponding tapered edges of said shield and said shield support form said cavity.

28. The apparatus of claim 18 wherein said shield further comprises a plurality units.

29. The apparatus of claim 28 wherein said shield comprises two units, an inner unit adjacent to said susceptor, and an outer unit having an inner edge that engages an outer edge of said inner unit.

30. The apparatus of claim 29 wherein said outer edge of said susceptor is inwardly tapered from said bottom surface to said top surface and said inner edge of said inner unit further comprises an inner edge that is outwardly tapered from a top surface to a bottom surface at an angle that is substantially similar to an angle of taper of said outer edge of said susceptor.

31. The apparatus of claim 30 wherein said inner unit of said shield contains a lip extending inwardly from said inner edge to engage a top edge of said semiconductor wafer.

32. The apparatus of claim 30 wherein said outer edge of said inner unit is tapered to match an angle of taper of said inner edge of said outer unit.

33. The apparatus of claim 29 wherein said outer unit is supported proximate said inner unit by a shield support.

34. The apparatus of claim 29 wherein said inner and outer units have annular plan forms.

* * * * *